(12) United States Patent
Selvamanickam et al.

(10) Patent No.: US 7,531,205 B2
(45) Date of Patent: *May 12, 2009

(54) HIGH THROUGHPUT ION BEAM ASSISTED DEPOSITION (IBAD)

(75) Inventors: Venkat Selvamanickam, Wynantskill, NY (US); Srinivas Sathiraju, Riverside, OH (US)

(73) Assignee: Superpower, Inc., Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/602,467

(22) Filed: Jun. 23, 2003

(65) Prior Publication Data

US 2004/0258851 A1 Dec. 23, 2004

(51) Int. Cl.
*B05D 5/12* (2006.01)
*C23C 14/00* (2006.01)
*H01L 39/24* (2006.01)

(52) U.S. Cl. .................. 427/62; 427/523; 427/533; 427/562; 505/325; 505/434; 505/470; 505/480; 29/599

(58) Field of Classification Search .............. 427/62, 427/523, 533, 562; 505/325, 434, 470, 480; 29/599; 204/192.24
See application file for complete search history.

(56) References Cited

U.S. PATENT DOCUMENTS 5,236,509 A * 8/1993 Sioshansi et al. ............ 118/719
5,432,151 A * 7/1995 Russo et al. ................. 505/474
5,650,378 A * 7/1997 Iijima et al. ................. 505/473
6,190,752 B1 * 2/2001 Do et al. ...................... 428/141
6,214,772 B1 * 4/2001 Iijima et al. ................. 505/475
6,236,163 B1 * 5/2001 Maishev et al. ......... 315/111.81
6,319,326 B1 * 11/2001 Koh et al. .................... 118/718
6,783,637 B2 * 8/2004 Slaughter et al. ....... 204/192.11
6,797,313 B2 * 9/2004 Fritzemeier et al. .......... 427/62
6,899,928 B1 * 5/2005 Groves et al. ............... 427/529
2004/0168636 A1 * 9/2004 Savvides et al. ...... 118/723 CB

FOREIGN PATENT DOCUMENTS

JP 04-331795 * 11/1992

OTHER PUBLICATIONS

In Plane Texturing Control of YBACUO Thin Films on POIycrystalline Substrates By Ion-Beam-Modified Intermediate Buffer Layers, Iijima et al., IEEE vol. 3, No. 1, Mar. 1993, pp. 1510-1515.*
Biaxially Aligned YSZ Buffer Layer on Polycrystalline Substrates, Iijima et al., International Symposium on Superconductivity, Oct. 14-17, 1991, Tokyo Japan, pp. 1-4.*

(Continued)

*Primary Examiner*—Brian K Talbot
(74) *Attorney, Agent, or Firm*—Larson Newman Abel & Polansky, LLP

(57) ABSTRACT

A method of continuously coating at least one substrate with a buffer layer as a support for a ceramic superconducting material is disclosed. The method includes loading the at least one substrate onto a respective feed spool and feeding the at least one substrate through a vacuum deposition chamber. The method further includes coating the at least one substrate while the at least one substrate is bombarded by ion beams from dual RF-ion sources forming at least one coated substrate, and reloading the at least one coated substrate onto a respective take up spool.

14 Claims, 5 Drawing Sheets

OTHER PUBLICATIONS

Structural and Transport properties of Biaxilly aligned YBACUO film on Polycrstalline Ni-based alloy with Ion Beam Modified buffer layers, Iijima et al., Journal of Applied Physics, vol. 73(3) Aug. 1, 1993, pp. 1905-1911.*

In-plane aligned YBACUO thin films depsoited on polycrystalline metallic substartes, Iijima et al., Applied Physcis Leters, vol. 60(6) Feb. 10, 1992, pp. 769-771.*

* cited by examiner

HIGH THROUGHPUT ION BEAM ASSISTED DEPOSITION (IBAD)

FIELD OF THE INVENTION

The present invention relates to an ion beam-assisted deposition (IBAD) system and method of utilizing such a system. More specifically, the present invention relates to large-scale ion beam-assisted deposition of thin films, such as the buffer layers of high-temperature superconducting (HTS) tapes.

BACKGROUND OF THE INVENTION

Wire forms the basic building block of the world's electric power system, including transformers, transmission and distribution systems, and motors. The discovery of revolutionary HTS compounds in 1986 led to the development of a radically new type of wire for the power industry; this discovery is the most fundamental advance in wire technology in more than a century. However, to date only short samples of the HTS tape used in the manufacture of next-generation HTS wires have been fabricated at high performance levels. In order for HTS technology to become commercially viable for use in the power generation and distribution industry, it will be necessary to develop techniques for continuous, high-throughput production of HTS tape.

Ion beam-assisted deposition processes, such as is described in Iijima, et al., U.S. Pat. No. 6,214,772, dated Apr. 10, 2001 and entitled "Process for Preparing Polycrystalline Thin Film, Process for Preparing Oxide Superconductor, and Apparatus Therefore," has shown great promise in creating desirable buffer layer characteristics as a support for a functional layer of a ceramic superconducting material, such as yttrium-barium-copper-oxide (YBCO) atop the buffering layers of yttrium-stabilized zirconia (YSZ) and cerium oxide ($CeO_2$).

During IBAD, a vacuum-deposition process that combines physical vapor deposition (PVD) with ion beam bombardment occurs: a vapor of coating atoms is generated with an electron beam evaporator or ion beam sputter source or magnetron sputter source and is deposited on a substrate. Ions are simultaneously extracted from a plasma from an ion source and accelerated into the growing PVD film at energies of a few hundred electron-volts (eV). The ions impart substantial energy to the coating and coating/substrate interface.

This achieves the benefits of substrate heating (which generally provides a denser, more uniform film) without significantly heating the substrate material and degrading bulk properties. The ions also interact with the coating atoms, driving them into the substrate and producing a graded material interface, which enhances adhesion. These factors combine to allow the deposition of uniform, adherent, low-stress films of virtually any coating material on most substrates. In addition, concurrent ion beam bombardment of a growing film has been shown to impart biaxial texture. IBAD has been specifically used for this purpose to achieve a high-degree of biaxial texture in materials used as buffer layers for HTS tapes.

Prior art IBAD processes, especially those used to achieve biaxial texture in buffer layers for HTS tapes are well known for their slow deposition rates. The deposition rates are excruciating slow, around 1 Angstrom/second. The low deposition rate severely restricts the throughput of the process. One possibility to increase the throughput is to increase the area of the deposition zone. The high-throughput continuous deposition of buffer layers necessary to enable cost-effective and, consequently, widespread adaptation of HTS materials in the electricity transmission/distribution industry necessitates an increase in the deposition zone that is achievable through the prior art.

It is thus an object of this invention to provide a high-throughput IBAD system that achieves a deposition zone of sufficient width to achieve optimum thin film characteristics atop multiple translating substrate tapes.

BRIEF SUMMARY OF THE PRESENT INVENTION

The present invention is an IBAD system characterized by increased throughput compared to prior art IBAD systems, while still achieving optimum thin film quality. The IBAD system of the present invention includes a bi-lateral arrangement of radio frequency (RF) ion sources that create a deposition zone of sufficient width to enable simultaneous deposition onto a plurality of translating metal substrate tapes arranged parallel to one another. The bilateral RF ion sources are arranged on opposite sides of a source of coating material in such a manner that a pair of ion beams is directed toward the substrate tapes at incident angles of, for example, 55 degrees normal to the tape surface.

A novel multiple spool feed system that serves to translate the plurality of substrate tapes through the system at optimum tension and speed is further disclosed. The system can accommodate form 2 to 16 tapes, desirably 6 to 12 and most preferably 8 to 10 simultaneously translating tapes.

The present invention is particularly well suited to the high-throughput, cost-effective deposition of the buffer layers of HTS tapes.

DETAILED DESCRIPTION OF THIS INVENTION

Figure 1:
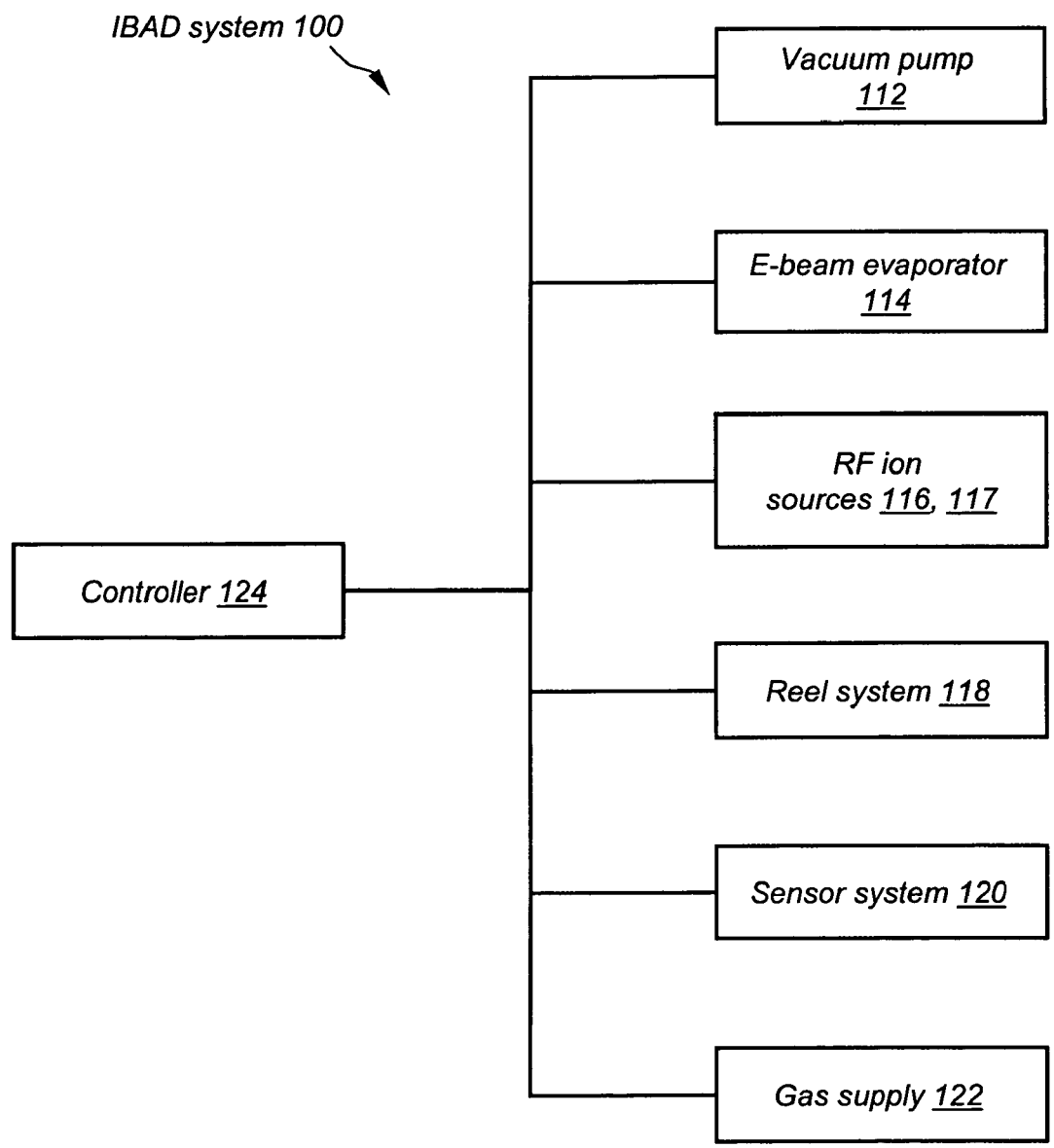
FIG. 1 illustrates a block diagram of the IBAD system of the present invention depicting the functional relationships between the subsystems of the IBAD system.

FIG. 1 illustrates a high-level block diagram of an IBAD system 100 in accordance with the invention, depicting the functional relationships between each subsystem. The IBAD system 100 includes a plurality of subsystems as follows:

a commercially available vacuum pump 112 that is capable of maintaining a vacuum of pressure in the order of magnitude of $10^{-5}$ Torr. One example of such a pump is an APD Cryogenics, Marathon 16 cryopump.

an energy source 114 such as an electron beam (e-beam) evaporator or ion beam or magnetron sputtering source, that produces a vapor of depositing material via the erosion of the surface of a solid source. The e-beam evaporator 114 assembly includes elements that are described in reference to FIG. 2.

a first RF ion source 116 and a second RF ion source 117 that are commercially available ion sources such as a pair of Veeco-Ion Tech, RF 6*22 linear sources using a voltage of 1500 volts and having a power rating of 500 W;

a reel system 118 that is a reel-to-reel tape transport system serving to translate multiple strands of substrate tape through the IBAD system 100. The reel system 118 includes a series of spools, motors, tachometers, shafts, and feed-throughs, as are described in reference to subsequent figures. Further details of the reel system 118 are described in reference to FIGS. 2, 3, and 5;

a sensor system 120 that is a series of sensors that monitor process conditions and parameters of the IBAD system 100. The sensor system 120 may include pressure gauges, film thickness sensors, a Faraday cup, and a temperature-sensing unit, as are described below. Further details of the sensor system 120 are described in reference to FIGS. 2 and 4;

a gas supply 122 that is a gas injection system that provides gases, e.g. argon, nitrogen, helium and/or oxygen, at a flow rate to meet process specifications. The gas supply 122 may include a tank farm as well as a series of valves and flow meters and is described below in reference to FIG. 2; and a controller 124 with a plurality of inputs and outputs that meet the requirements of the peripherals described in reference to FIG. 2. The controller 124 may be one or more micro-controllers or a PC with appropriate hardware & software. The controller 124 is electrically coupled to and provides control to the vacuum pump 112, the e-beam evaporator 114, the RF ion sources 116 and 117, the reel system 118, the sensor system 120, and the gas supply 122.

Functional connections exist among the vacuum pump 112, the energy source 114, such as an e-beam evaporator, the RF ion source 116, the RF ion source 117, the reel system 118, the sensor system 120, the gas supply 122, and the IBAD chamber (described below).

Figure 2:
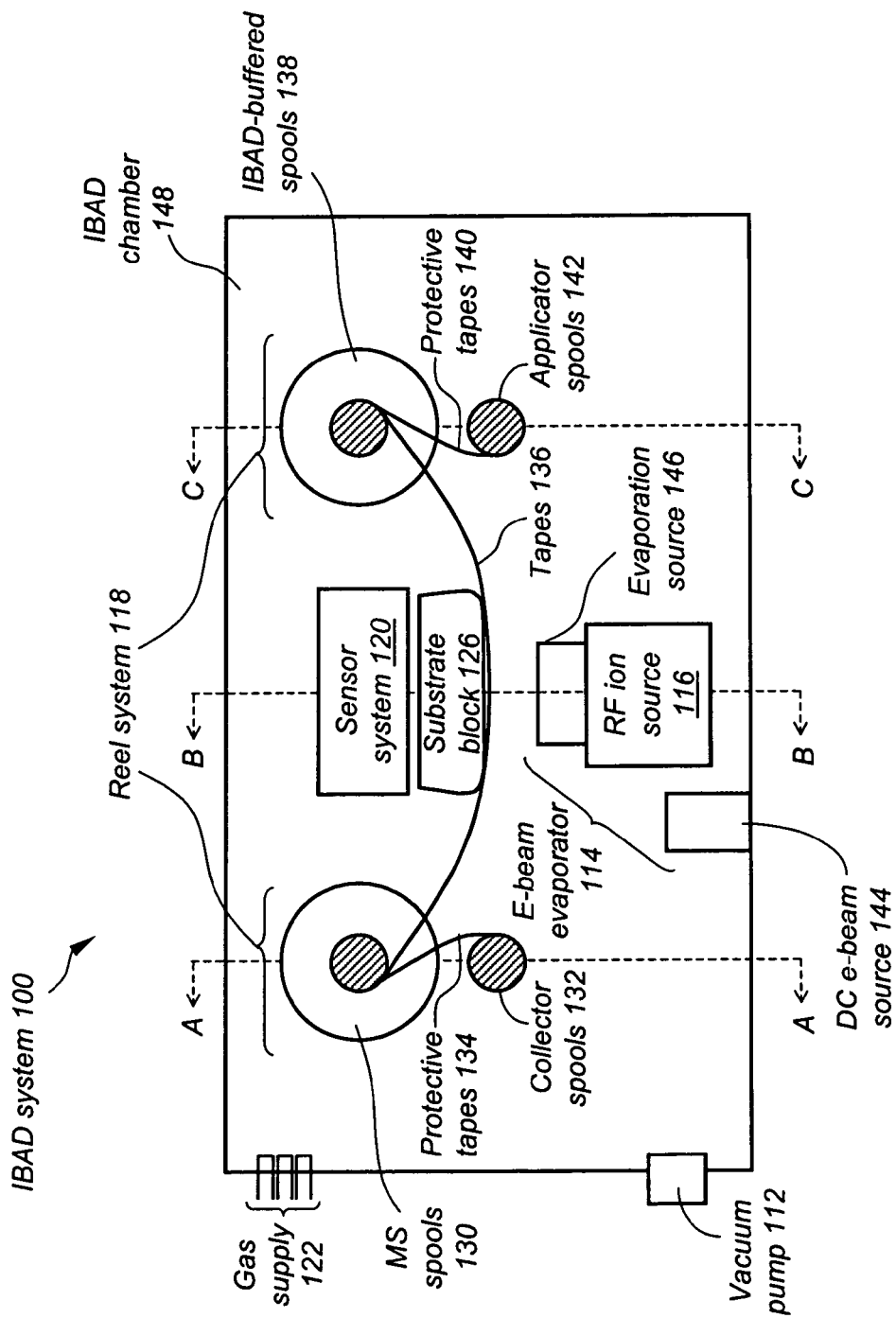
FIG. 2 illustrates a front view of the IBAD system of the present invention.

FIG. 2 illustrates a front view of the IBAD system 100 apparatus. This view shows that the IBAD system 100 further includes an IBAD chamber 148 that is a pressurized vacuum chamber. The IBAD chamber 148 may be constructed of any non-corroding metal, such as 304 stainless steel. The IBAD chamber 148 includes all the necessary gaskets, seals, and seal plates to maintain a vacuum to the order of $10^{-7}$ Torr.

As shown in FIG. 2, the vacuum pump 112 and the gas supply 122 are disposed in the outer wall of the IBAD chamber 148. The vacuum pump 112 is functionally connected such that a vacuum seal is maintained.

A substrate block 126 is disposed within the IBAD chamber 148 in close proximity to the sensor system 120. A plurality of tapes 136 come into contact with and translates underneath the substrate block 126 via the action of elements of the reel system 118, which may or may not be disposed inside the IBAD chamber 148. The reel system 118 includes a plurality of metal substrate (MS) spools 130, a plurality of collector spools 132, a plurality of protective tapes 134, a plurality of IBAD-buffered spools 138, a plurality of protective tapes 140, and a plurality of applicator spools 142.

Figure 4:
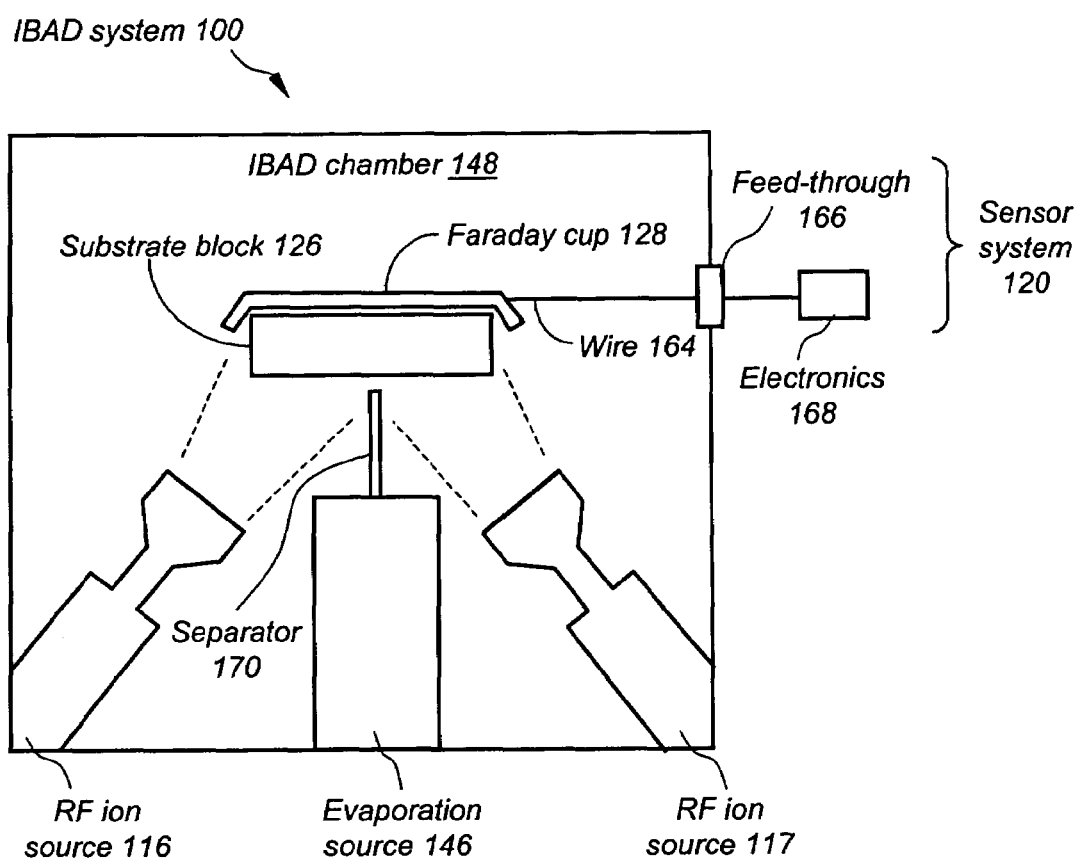
FIG. 4 illustrates a cross-sectional view of the IBAD system of the present invention taken along line B-B of FIG. 2.

Also disposed within the IBAD system 100 are the energy source to vaporize the coating material 114, which may be e-beam evaporator, which includes a DC E-beam source 144, or an ion beam or magnetron sputtering system [not shown], and a coating source 146. The coating source 146 is oriented within the IBAD chamber 148 between the RF ion source 116 and the RF ion source 117 (not shown), and is horizontally aligned with the center of the substrate block 126, as illustrated in FIG. 4. Similarly, the DC e-beam source 144 or ion beam or magnetron sputtering system is aligned with the coating source 146 as per the specifications from the manufacturer of the DC e-beam source 144 or the ion beam or magnetron sputtering system.

Furthermore, the RF ion sources 116 and 117 are arranged on opposite sides of the coating source 146 in such a manner that a pair of ion beams (not shown) is directed toward the substrate tapes 136 at incident angles of, for example, 55 degrees normal to the tape surface, as illustrated in FIG. 4.

The substrate block 126 is a metal block having an internal coolant passageway loop to increase the heat dissipation capacity. The substrate block 126 incorporates all necessary mounting holes and coolant connectors. The substrate block 126 is positioned within the IBAD chamber 148 such that a deposition zone for a plurality of tapes 136 is created at the surface of the substrate block 126. In addition, the substrate block 126 may include a shutter (not shown) that can be opened or closed to expose the tapes 136 to the deposition zone.

The tapes 136 are lengths of material formed from a variety of metals capable of withstanding temperatures up to 900° C. and suitable for IBAD, such as stainless steel or a nickel alloy such as Inconel. The dimensions of the tapes 136 may vary to meet the desired finished product and system limitations. For example, the tapes 136 may have a thickness of 25 microns, a width of 1 cm and a length of 100 meters.

The DC e-beam source 144 is a commercially available electron source having the capability of dynamically controlling the trajectory of a beam of electrons. One example of a commercially available e-beam source is a Thermionics (Thermionics Vacuum Products, 231 Otto St., Port Townsend, Wash. 98368) source having a power rating of 10 kW. Other suitable e-beam sources are available in power ranges of from 1 to 20 kW.

The ion beam and magnetron sputtering systems are also commercially available units.

The coating source 146 is a commercially available deposition source composed of material such as yttria-stabilized zirconium (YSZ) or Magnesium Oxide (MgO) suitable for exposure to electron bombardment. Other evaporation sources suitable for use as a buffer with YBCO may also be used. The coating source 146 is a consumable and can be purchased from e.g. Transdec. The electrons delivered to the coating source 146 by the DC e-beam source 144 or ion beam or magnetron sputtering source, heat and evaporate the material of the coating source 146, forming a gas which is subsequently deposited onto the tapes 136 with the assistance of embedding ions emitted from the RF ion sources 116 and 117.

The MS spools 130 are spools on which the non-IBAD processed tapes 136 and the plurality of protective tapes 134 are wound in alternating layers. The diameter and width of the MS spools 130 may vary with the dimensions of the desired product. The MS spools 130 may be constructed from a variety of materials capable of withstanding vacuum chamber conditions. A typical material is anodized aluminum.

The IBAD-buffered spools 138 are constructed from similar material and dimensions to the MS spools 130. The IBAD-buffered spools 138 are spools onto which the tapes 136 and the protective tapes 140 wind after the tapes 136 have undergone an IBAD process.

The protective tapes 134 and the protective tapes 140 are polymeric tapes having protective properties such as scratch-resistant surfaces, and serve to protect the layers of the tapes 136 wound about the MS spools 130 and the IBAD-buffered spools 138. A useful protective tape is one composed of kapton. The dimensions of the protective tapes 134 and the protective tapes 140 correspond to the dimensions of the tapes 136, as described below.

The collector spools 132 are spools similar to the MS spools 130, onto which the protective tapes 134 wind as the tapes 136 and the protective tapes 134 unwind from the MS spools 130. The collector spools 132 may be constructed from a variety of materials capable of withstanding IBAD vacuum chamber conditions.

The applicator spools 142 are of similar material and dimensions to the collector spools 132 and are the spools from which the protective tapes 140 unwind as the protective tapes 140 are interleaved with the tapes 136 onto the IBAD-buffered spools 138.

Figure 3:
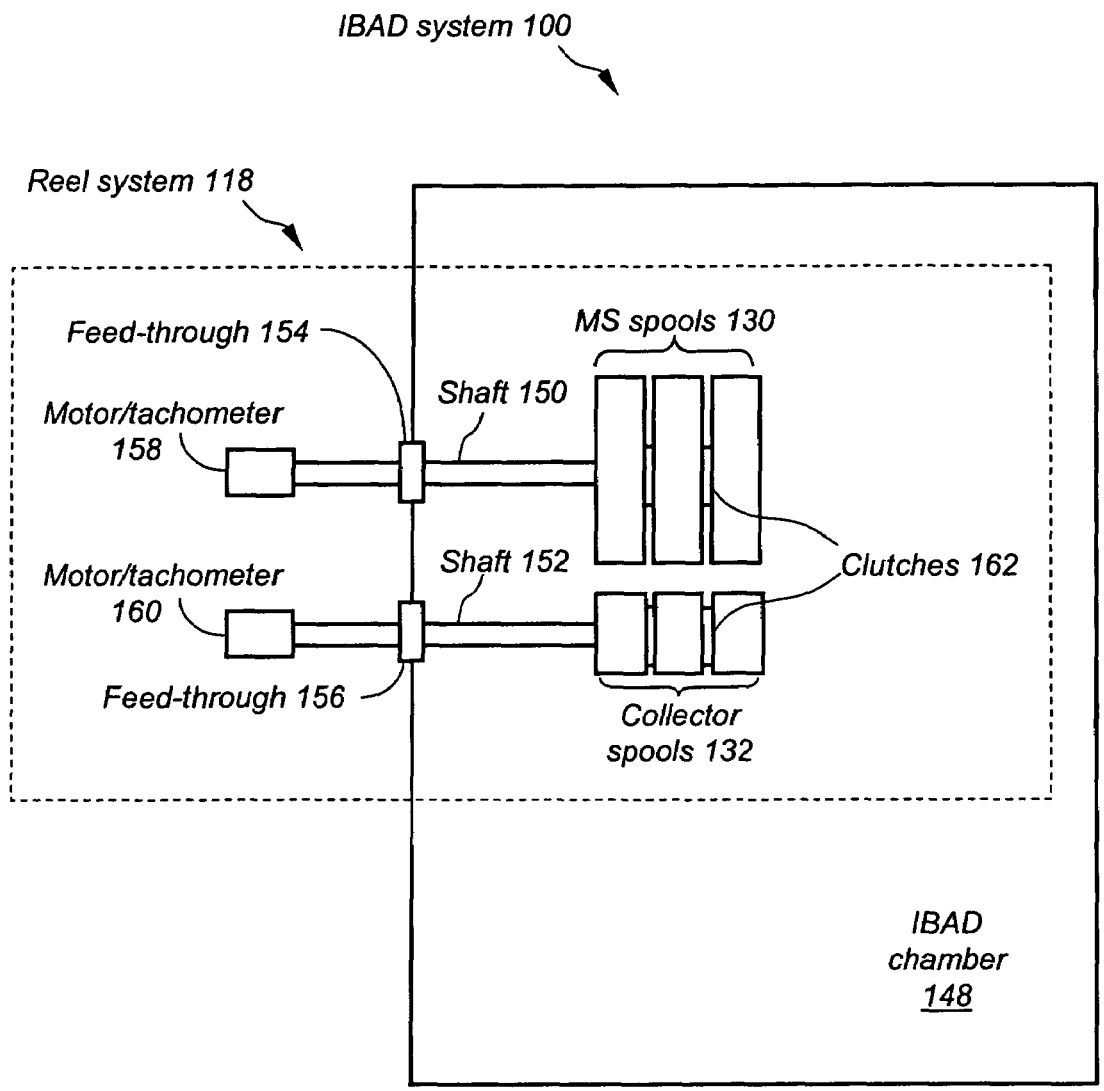
FIG. 3 illustrates a cross-sectional view of the IBAD system of the present invention taken along line A-A of FIG. 2.

The MS spools 130 and the collector spools 132 are further described in reference to FIG. 3. The protective tapes 134 are wound simultaneously with the tapes 136 about the MS spools 130, such that a winding of the protective tape 134 exists between each layer of wound tape 136. The protective tapes 134 wind onto the collector spools 132 as the tapes 136 unwind from the MS spools 130. The tapes 136 come into contact with the surface of the substrate block 126 as they span from the MS spools 130 to the IBAD-buffered spools 138. The tapes 136 are wound simultaneously with the protective tapes 140 onto the IBAD-buffered spools 138, such that a layer of the protective tapes 140 exist between each layer of the tapes 136 on the IBAD-buffered spools 138. The protective tapes 140 unwind from the applicator spools 142 and wind onto the IBAD-buffered spools 138.

FIG. 3 illustrates a cross-sectional view of the IBAD system 100 taken along line A-A of FIG. 2 such that further details of the reel system 118 are illustrated. The reel system 118 includes the MS spools 130, the collector spools 132, a shaft 150, a shaft 152, a feed-though 154, a feed-through 156, a motor/tachometer 158, a motor/tachometer 160, and a plurality of clutches 162.

The shafts 150 and 152 are commercially available drive shafts capable of supporting the loads and stresses of the MS spools 130 and the collector spools 132, respectively.

The clutches 162 are commercially available elements that connect multiple spools to a single shaft in such a manner that each spool experiences the same torque as transmitted by the shaft. The number of clutches 162 that exist on each of the shafts 150 and 152 corresponds to the number of the tapes 136 that translate through the IBAD chamber 148.

The feed-throughs 154 and 156 are commercially available feed-throughs, such as those produced by Ferrofluidics, and allow the shafts 150 and 152, respectively, to pass through the wall of the IBAD chamber 148 while still maintaining a vacuum seal.

The motors/tachometers 158 and 160 are commercially available motor and tachometer systems capable of translating the tapes 136 and protective tapes 134, respectively, at speeds between 0.5 and 300 meters/hour, usefully with an accuracy of +/−1% of the linear speed. The translation speed varies widely since IBAD may be utilized with a material that textures slowly, such as YSZ, or one that textures quickly, such as MgO. For YSZ, a speed in the range of from about 0.5 to about 5.0 m/hr is useful; for MgO a speed in the range for from about 20 to about 300 m/hr is useful.

The MS spools 130 exist within the IBAD chamber 148 and are functionally connected to the shaft 150, which passes through the feed-through 154 while still maintaining a vacuum seal. The shaft 150 is then functionally connected to the motor/tachometer 158. The feed-through 154 is functionally integrated into the IBAD chamber 148, such that a seal is maintained between the feed-through 154 and the IBAD chamber 148.

Similarly, the collector spools 132 exist within the IBAD chamber 148. The collector spools 132 are functionally connected to the shaft 152, which passes through the feed-through 156 while still maintaining a vacuum seal. The shaft 152 is then functionally connected to the motor/tachometer 160. The feed-through 156 is functionally integrated into the IBAD chamber 148, such that a seal is maintained between the feed-through 156 and the IBAD chamber 148.

Alternately, the feedthroughs 154 and 156 may serve to pass the shafts 150 and 152 through the wall of a chamber adjacent to and dynamically isolated from the IBAD chamber 148, such that the MS spools 130 and the collector spools 132 are housed in the adjacent chamber and translate the tapes 136 and the protective tapes 134, respectively, through a slit in the wall of the IBAD chamber 148 capable of maintaining the vacuum requirements of the IBAD chamber 148.

FIG. 4 illustrates a cross-sectional view of the IBAD system 100 taken along line B-B of FIG. 2, such that further details of the RF ion sources 116 and 117 and the sensor system 120 are shown disposed within the IBAD chamber 148.

The RF ion sources 116 and 117 emit ion beams (not shown) that are focused on the substrate block 126 and separated by a separator 170 mounted on the evaporation source 146. The sensor system 120 is shown to further include a Faraday cup 128, a wire 164, a feed-through 166, and a system of electronics 168.

The Faraday cup 128 is a device capable of collecting and detecting ions. It includes a coaxial cable (not shown) bent at an angle, for example 55 degrees, an ion collector plate (not shown), and a metallic shield/collector (not shown). The Faraday cup 128 is an element of the sensor system 120. The Faraday cup 128 is mechanically fastened to a surface of the substrate block 126, as described in further detail in reference to FIG. 4.

The wire 164 is any commercially available shielded wire capable of transmitting an electrical signal. The wire 164 may include a high-temperature resistant sheath such as Teflon.

The feed-through 166 is a commercially available feed-through that is capable of allowing a signal wire to pass through the wall of the IBAD chamber 148 while still maintaining a vacuum seal.

The electronics 168 is a system of electronics that detects an ion charge sensed by the Faraday cup 128 and generates a corresponding electric signal.

The separator 170 is a barricade that is impervious to ions ejected from the RF ion sources 116 and 117. The separator 170 is composed of a material characterized by a low sputtering yield and a chemical compatibility with the IBAD thin film. One example is a sheet of zirconium oxide or a stainless steel sheet coated with a layer of zirconium oxide. The separator may be coated with whatever oxide is being used for the buffer layer. The separator 170 is disposed upon a stationary fixture within the IBAD chamber 148 near the center of the translating tapes 136 in such an orientation as to be in closer proximity to the substrate block 126 than to the RF ion sources 116 and 117.

The Faraday cup 128 is fixedly attached to a surface of the substrate block 126 such that the Faraday cup 128 is aligned with the direction of propagation of ions from the RF ion sources 116 and 117. Alternately, a plurality of Faraday cups 128 with a variety of different orientations may exist to monitor ion emissions released from the RF ion sources 116 and 117. The Faraday cup 128 is electrically coupled to the wire 164, which in turn passes through the feed-through 166 and is electrically coupled to the electronics 168. The feed-through 166 is functionally integrated into the IBAD chamber 148 such that a seal is maintained between the feed-through 166 and the IBAD chamber 148. The electronics 168 exist outside of the IBAD chamber 148.

The coating source 146 is disposed within the IBAD chamber 148 such that the longitudinal axis of the coating source 146 is aligned with the longitudinal axis of the substrate block 126. The RF ion sources 116 and 117 exist within the IBAD chamber 148 on opposite sides of the coating source 146 in such a manner that a pair of ion beams is directed toward the substrate tapes 136 at incident angles of, for example, 55 degrees.

Figure 5:
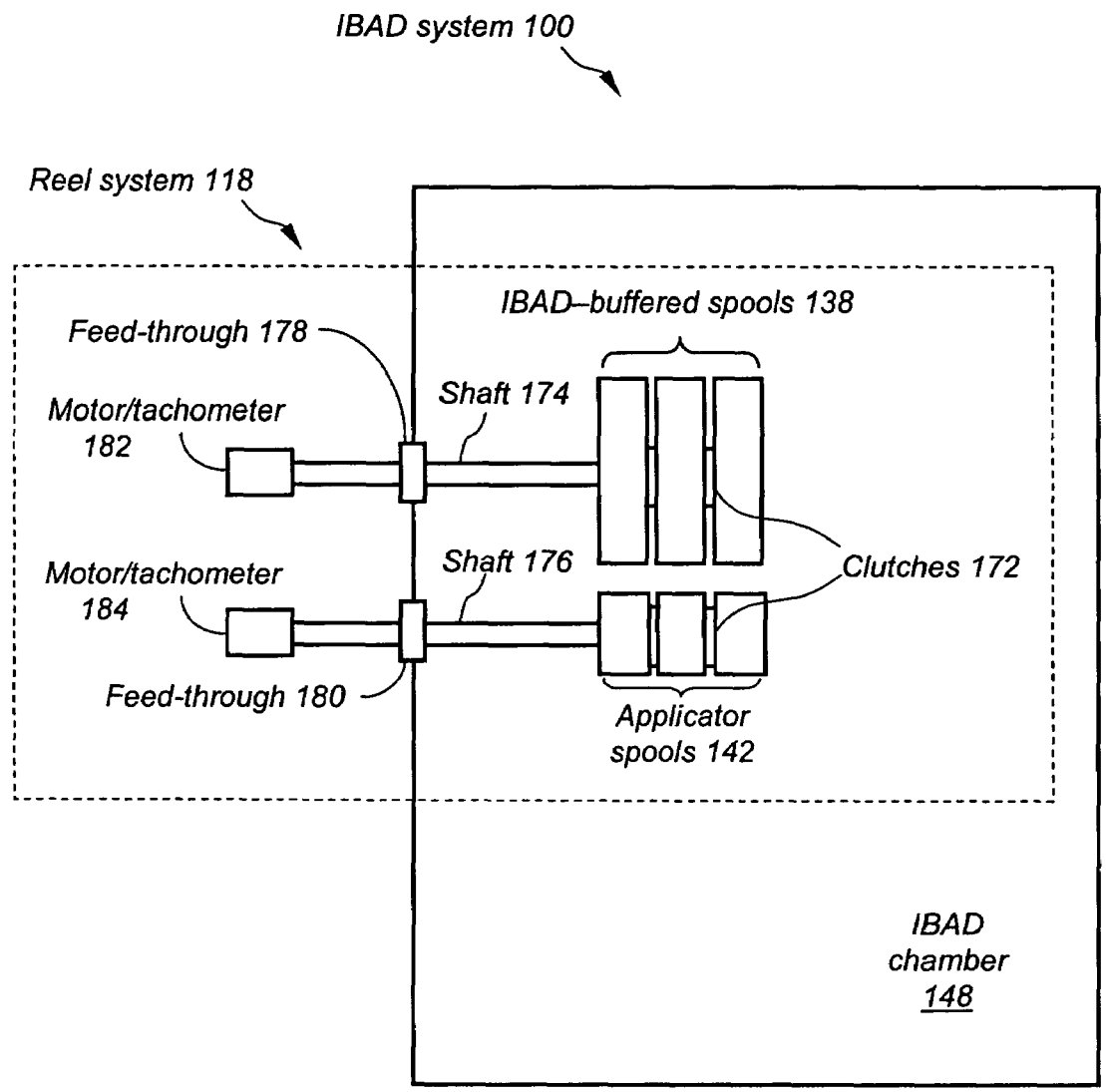
FIG. 5 illustrates a cross-sectional view of the IBAD system of the present invention taken along line C-C of FIG. 2.

FIG. 5 illustrates a cross-sectional view of the IBAD system 100 taken along line C-C of FIG. 2 such that further details of the reel system 118 are shown disposed within the IBAD chamber 148. The reel system 118 includes the IBAD-buffered spools 138, the applicator spools 142, a plurality of clutches 172, a shaft 174, a shaft 176, a feed-through 178, a feed-through 180, a motor/tachometer 182, and a motor/tachometer 184.

The clutches 172 are commercially available clutches that are capable of connecting multiple spools to a shaft, such that each spool experiences the same torque as transmitted by the clutches 172. For simplicity, only three clutches 172 are shown in FIG. 5; in practice, upwards of sixteen tapes 136 may translate through the IBAD chamber 148 simultaneously, requiring a corresponding number of the clutches 172. We prefer to utilize 2 to 16, preferably 6 to 12, most preferably 8 to 10 simultaneously translating tapes.

The shafts 174 and 176 are commercially available drive shafts capable of supporting the loads and stresses of the IBAD-buffered spools 138 and the applicator spools 142, respectively, and are elements of the reel system 118.

The feed-throughs 178 and 180 are commercially available feed-throughs, such as those produced by Ferrofluidics, and allow the shafts 174 and 176, respectively, to pass through the wall of the IBAD chamber 148 while still maintaining a vacuum seal.

The motors/tachometers 182 and 184 are commercially available motor and tachometer systems capable of translating the tapes 136 and protective tapes 140, respectively, at speeds between 0.1 and 50 meters/hour with an accuracy of +/−1% of the linear speed.

The IBAD-buffered spools 138 exist within the IBAD chamber 148 and are functionally connected to the shaft 174, which passes through the feed-through 178 while still maintaining a vacuum seal. The shaft 174 is then functionally connected to the motor/tachometer 182. Similarly, the applicator spools 142 exist within the IBAD chamber 148. The applicator spools 142 are functionally connected to the shaft 176, which passes through the feed-through 180 while still maintaining a vacuum seal. The shaft 176 is then functionally connected to the motor/tachometer 184. Alternately, the feedthroughs 178 and 180 may serve to pass the shafts 174 and 176, respectively, through the wall of a chamber adjacent to and dynamically isolated from the IBAD chamber 148, such that the IBAD-buffered spools 138 and the applicator spools 142 are housed in the adjacent chamber and translate the tapes 136 and the protective tapes 140, respectively, through a slit in the wall of the IBAD chamber 148 capable of maintaining the vacuum requirements of the IBAD chamber 148.

In operation and in reference to the IBAD system 100 described in FIG. 1, FIG. 2, FIG. 3, FIG. 4, and FIG. 5, the sensor system 120 continuously monitors conditions and system parameters within the IBAD system 100. The sensor system 120 transmits the observed data as electric signals to the controller 124. The controller 124 then processes the electric signals received from the sensor system 120 using a set algorithm or program embedded in the memory of the controller 124 to optimize the IBAD system 100 performance. The controller 124 then sends a separate and appropriate electric signal to the vacuum pump 112, the e-beam evaporator 114, the RF ion source 116, the RF ion source 117, the reel system 118, the sensor system 120, and the gas supply 122, thereby controlling the devices' performance appropriately.

The controller 124 commands the gas supply 122 to inject gases into the IBAD chamber 148. Similarly, the controller 124 commands the vacuum pump 112 to exhaust chamber gases to create an appropriate vacuum. The motor/tachometer 158 rotates the shaft 150 that passes through the feed-through 154 and in turn rotates one of the clutches 162. The clutches 162 then provide equal torque to each of the MS spools 130. Similarly, the motor/tachometer 160 rotates the shaft 152 that passes through the feed-through 156 and in turn rotates one of the clutches 162. The clutches 162 then provide equal torque to each of the collector spools 132.

The shaft 152 and the collector spools 132 rotate in such a manner that as the plurality of tapes 136 unwind from the MS spools 130, the protective tapes 134 simultaneously wind onto the collector spools 132 at an equal rate. Similarly, the tapes 136 unwind from the MS spools 130. The controller 124 controls and monitors the motors/tachometers 158 and 160 to maintain a desired feed-rate and tension across all the tapes 136. Additionally, tension can be monitored actively with the use of a load cell mechanism.

A load cell may come into contact with the tapes 136 and communicate actively with the controller 124 in a feedback loop. The controller 124 may compare the communicated tension with a preset tension value stored within its memory and subsequently adjust the tension of the tapes 136 via control of one of the motor/tachometers 158 and 160.

The tapes 136 then contact the substrate block 126, at which point the tapes 136 are in the deposition zone of the IBAD chamber 148. The tapes 136 are exposed to vapor emitted from the coating source 146. The coating source 146 emits a vapor upon bombardment by the DC e-beam source 144 or ion beam or magnetron source. Similarly, the tapes 136 are bombarded by ions emitted from the RF ion sources 116 and 117. The Faraday cup 128 detects ions released from the RF ion sources 116 and 117 at the substrate block 126, and forms an electric current in proportion to the amount of ions impinging upon the Faraday cup 128. This electric signal is transmitted via the wire 164 through the feed-through 166 to the electronics 168. The electronics 168 convert the electric current to a signal proportional to the amplitude of the electric current sensed by the Faraday cup 128 and transmit a new electric signal to the controller 124.

The motor/tachometer 182 rotates the shaft 174 that passes through the feed-through 178 and in turn rotates one of the clutches 172. The clutches 172 then provide equal torque to each of IBAD-buffered spools 138. Similarly, the motor/tachometer 184 rotates the shaft 176 that passes through the feed-through 180 and in turn rotates one of the clutches 172. The clutches 172 then provide equal torque to each of the applicator spools 142. The motor/tachometer 184 and the applicator spools 142 rotate in such a manner that as the protective tapes 140 unwind from the applicator spools 142, the protective tapes 140 simultaneously wind onto the IBAD-buffered spools 138 at an equal rate. Similarly, the tapes 136 wind onto the IBAD-buffered spools 138, such that for every wind of the tapes 136 on the IBAD-buffered spools 138 there exists a wind of the protective tapes 140. The controller 124 controls and monitors the motor/tachometer 182 and the motor/tachometer 184 to maintain a desired feed-rate and tension across all the tapes 136.

The inclusion of the RF ion sources 116 and 117 in conjunction with the e-beam evaporator 114 assembly enables a deposition zone to be created of sufficient width to enable the plurality of tapes 136 to translate through the IBAD chamber 148 and receive optimum thin film deposition. The translational velocity of the tapes 136 through the IBAD chamber 148, and thus the deposition rate per tape, is similar to the IBAD systems of the prior art in which deposition occurs upon a single tape. Thus, the IBAD system 100 has increased throughput over the prior art a factor on the order of the number of the tapes 136 translating parallel to one another.

The invention claimed is:

1. A method of continuously coating at least one substrate with a buffer layer as a support for a ceramic superconducting material comprising:
   loading the at least one substrate having a width and opposite major surfaces onto a respective feed spool;
   feeding the at least one substrate across a substrate block within a deposition zone in a vacuum deposition chamber wherein a coating generated from a single deposition source is applied to the at least one substrate white the at least one substrate is bombarded by ions from a dual RF-ion source along the deposition zone;
   forming at least one coated substrate within the deposition zone; and
   reloading the at least one coated substrate onto a respective take-up spool,
   wherein the dual RF-ion source includes first and second RF-ion sources bi-laterally oriented with respect to the at least one substrate, on the same side of the substrate, and located such that a projection on a major surface of the at least one substrate of a line intersecting the first and second RF-ion sources is substantially perpendicular to the longitudinal axis of the at least one substrate so as to be aimed at respective first and second portions of the same major surface of the at least one substrate and bombard the respective first and second portions of the same major surface of the at least one substrate, wherein the first portion and the second portion each span one-half the width of the at least one substrate such that the first and second portions span an entirety of the width of the at least one substrate and
   wherein a separator is disposed within the deposition chamber, between the bilaterally oriented dual RF-ion sources, and in closer proximity to the substrate block than to the dual RF-ion sources, the separator being oriented along a direction that longitudinally bisects the substrate block and functioning to barricade impingement of ions from the first RE-ion source on the second portion and barricade impingement of ions from the second RF-ion source on the first portion.

2. The method of claim 1 where the respective feed spool and take-up spools are located external to the deposition chamber.

3. The method of claim 1 where the at least one substrate is inter-spooled with kapton polymer protective tapes.

4. The method of claim 1 where the coating is generated from a deposition source, the deposition source is an electron beam evaporator.

5. The method of claim 1 where from about 2 to about 12 substrates are simultaneously being coated.

6. The method of claim 1 where at least two substrates are simultaneously being coated.

7. A method of continuously coating at least one substrate with a buffer layer as a support for a ceramic superconducting material comprising:
   providing at least one substrate feed spool of substrate, the substrate having a width and opposite major surfaces,
   unspooling and threading the at least one substrate through a vacuum deposition chamber,
   loading coating material that is to be deposited onto a surface of the at least one substrate into the vacuum deposition chamber,
   reducing the pressure in the deposition chamber to no greater than about $10^{-5}$ Torr,
   injecting oxygen into the deposition chamber,
   initializing dual RF-ion sources located in the deposition chamber to a pre-determined power level and trajectory where the resulting ion beams are directed toward the at least one substrate tape translating through a deposition zone in the deposition chamber, wherein the dual RF-ion source includes first and second RF-ion sources bi-laterally oriented with respect to the at least one substrate and on the same side of the substrate, the first and second RF-ion sources located such that a projection on a major surface of the at least one substrate of a line intersectin the first and second RF-ion sources is substantially perpendicular to the longitudinal axis of the at least one substrate so as to be aimed at respective first and see on portions of the same major surface of the at least one substrate and bombard the respective first and second portions of the same major surface of the at least one substrate, wherein the first portion and the second portion each span one-half the width of the at least one substrate such that the first and second portions span an entirety of the width of the at least one substrate and wherein a separator is disposed between the bilaterally oriented dual RF-ion sources and in closer proximity to the substrate block than to the dual RF-ion sources, the separator being oriented along a direction that longitudinally bisects a substrate block and functioning to barricade impingement of ions from the first RF-ion source on the second portion and barricade impingement of ions from the second RF-ion source on the first portion,
   eroding the coating material by bombarding the coating material with electrons or ions produced by an energy source selected from the group consisting of DC electron beam, magnetron and ion beam energy sources,
   feeding the at least one substrate across the substrate block through a deposition zone in the vacuum chamber,
   allowing the coating material eroded from the coating source to impinge upon a suflace of the at least one substrate for a period of time sufficient to deposit a coating of evaporated coating material onto the tape forming at least one coated substrate, and
   collecting the at least one coated substrate on a respective take-up spool.

8. The method of claim 7 wherein RF ion sources are arranged on opposite sides of the coating source in a manner such that the resulting ion beams are directed toward the at least one substrate at incident angles of approximately 55 degrees.

9. A method of continuously coating at least one substrate with a buffer layer as a support for a ceramic superconducting material, comprising:
   translating at least one substrate from a respective feed spool, through a deposition chamber, and onto a respective take-up spool, the deposition chamber having an internal volume defined by a plurality of walls, located within the internal volume are a substrate block having a width and a length, a single deposition source, a first and a second RF-ion sources, and a separator disposed between the first and the second RF-ion sources and in closer proximity to the substrate block than to the first and second RF-ion sources, the first and second RF-ion sources being bilaterally oriented with respect to the at least one substrate, the separator being oriented along a direction that bisects the substrate block along the length, wherein the at least one substrate provides multiple substrate portions translating across the substrate block;

depositing a coating generated from the single deposition source onto the multiple substrate portions while the multiple substrate portions are translating across the substrate block; and bombarding a first portion of the multiple substrate portions within a first region of the substrate block with ions from the first RF-ion source and a second portion of the multiple substrate portions within a second region of the substrate block with ions from the second RF-ion source while depositing the coating on the multiple substrate portions translating across the substrate block, the ions from the first and second RF-ion sources, the separator functioning to barricade impingement of ions from the first RF-ion source on the second portion and barricade impingement of the second RF-ion source on the first portion, wherein the first region and the second region each span one-half the width of the substrate block such that the first and second regions span an entirety of the width of the substrate block.

10. The method of claim 9, where the respective feed spool and the respective take-up spool are located external to the deposition chamber.

11. The method of claim 9, where the at least one substrate is inter-spooled with kapton polymer protective tapes.

12. The method of claim 9, where the deposition source is an electron beam evaporator.

13. The method of claim 9 where from about 2 to about 12 substrates are simultaneously being coated, each of the substrate portions provided by corresponding one of said about 2 to about 12 substrates.

14. The method of claim 9, where at least two substrates are simultaneously being coated.

* * * * *

UNITED STATES PATENT AND TRADEMARK OFFICE
CERTIFICATE OF CORRECTION

| | |
|---|---|
| PATENT NO. | : 7,531,205 B2 |
| APPLICATION NO. | : 10/602467 |
| DATED | : May 12, 2009 |
| INVENTOR(S) | : Venkat Selvamanickam et al. |

It is certified that error appears in the above-identified patent and that said Letters Patent is hereby corrected as shown below:

Column 10, line 23, please delete "intersectin" and insert therefor --intersecting--;
 line 26, please delete "see on" and insert therefor --second--; and
 line 49, please delete "sufface" and insert therefor --surface--.

Signed and Sealed this

Twenty-eighth Day of July, 2009

JOHN DOLL
*Acting Director of the United States Patent and Trademark Office*